(12) United States Patent
Beanland

(10) Patent No.: US 7,072,441 B2
(45) Date of Patent: Jul. 4, 2006

(54) ALIGNMENT DIFFRACTOMETER

(75) Inventor: Richard Beanland, Shutlanger (GB)

(73) Assignee: Bookham Technology, plc, Towcester (GB)

( * ) Notice: Subject to any disclaimer, the term of this patent is extended or adjusted under 35 U.S.C. 154(b) by 143 days.

(21) Appl. No.: 10/470,253

(22) PCT Filed: Jan. 23, 2002

(86) PCT No.: PCT/GB02/00270

§ 371 (c)(1),
(2), (4) Date: Dec. 2, 2003

(87) PCT Pub. No.: WO02/059696

PCT Pub. Date: Aug. 1, 2002

(65) Prior Publication Data

US 2004/0071262 A1    Apr. 15, 2004

(30) Foreign Application Priority Data

Jan. 23, 2001  (GB) ................................. 0101701.1

(51) Int. Cl.
G01N 23/207 (2006.01)
(52) U.S. Cl. ............................. 378/73; 378/71; 378/34
(58) Field of Classification Search .................. 378/34, 378/70, 71, 73, 205
See application file for complete search history.

(56) References Cited

U.S. PATENT DOCUMENTS

| 4,949,148 | A |   | 8/1990  | Bartelink  | 357/74  |
|-----------|---|---|---------|------------|---------|
| 5,073,918 | A | * | 12/1991 | Kamon      | 378/205 |
| 5,768,335 | A | * | 6/1998  | Shahid     | 378/73  |
| 6,055,293 | A | * | 4/2000  | Secrest    | 378/70  |
| 6,977,986 | B1| * | 12/2005 | Beanland et al. | 378/34 |

FOREIGN PATENT DOCUMENTS

| GB | 2 292 658 A    | 2/1996 |
| GB | 2 356 786 A    | 5/2001 |
| JP | 63 078016      | 4/1988 |
| JP | 63 155722      | 6/1988 |
| WO | WO 92/02041 A1 | 2/1992 |
| WO | WO 01/40876 A1 | 6/2001 |

* cited by examiner

Primary Examiner—Courtney Thomas
(74) Attorney, Agent, or Firm—Lahive & Cockfield, LLP; Anthony A. Laurentano, Esq.

(57) ABSTRACT

The invention is concerned with a method f alignment for aligning crystal planes of a wafer substrate (40) to lithographic features thereon, the method characterized in that it includes the steps of: (a) measuring angular orientation of a peripheral flat (200) of the substrate (40); (b) measuring a crystallographic plane orientation of the substrate (40); (c) determining an error angle (φ) between the annular orientation of the flat (200) and the crystallographic orientation; (d) angularly registering to the flat (200) in a lithographic tool; (e) rotating the substrate (40) by the error angle (φ); and (f) defining one or more feature layers on the substrate (40) using the lithographic tool, thereby angularly aligning the one or more feature layers to the crystallographic plane orientation. The invention is further concerned with an apparatus for performing a method of alignment as claimed in claim 1, the apparatus comprising: (a) a wafer flat measuring device (20) for measuring angular orientation of one or more peripheral flats (200) on a wafer substrate (40); (b) an X-ray diffractometer for measuring a crystallographic orientation of the substrate (40); and (c) a wafer chuck (100) for rotating the substrate relative to the wafer flat measuring device (1) and the X-ray diffractometer (30).

12 Claims, 1 Drawing Sheet

ALIGNMENT DIFFRACTOMETER

RELATED APPLICATIONS

This application is a 35 U.S.C. 371 national stage filing of International Application No. PCT/GB02/00270, filed 23 Jan. 2002, which claims priority to Great Britain Patent Application No. 0101701.1 filed on 23 Jan. 2001 in Great Britain. The contents of the aforementioned applications are hereby incorporated by reference.

BACKGROUND OF THE INVENTION

The present invention is concerned with a method of alignment, in particular, but not exclusively, with a method of angularly aligning semiconductor wafers during semiconductor lithographic processes associated with fabricating semiconductor devices.

Semiconductor wafers are conventionally angularly aligned in lithographic tools, for example in step-and-repeat cameras, by registering to one or more wafer flats formed in the wafers. When fabricating many types of semiconductor devices, for example logic devices such as dynamic memories, alignment of integrated circuit features, for example doped electrode regions and metal conductor tracks, to wafer crystal planes is not especially critical to device performance. However, high overlay accuracy of device layers is essential for achieving satisfactory device yield and operation.

In the case of micromachined devices, for example electro-optical devices such as solid-state lasers relying on the formation of mirror-like cleaved surfaces as functional components thereof, highly accurate angular alignment of device features to wafer crystal planes is critical. When this angular alignment is not accurately achieved, device dimensional tolerances become difficult to attain and cleaved surfaces can often include stepped features which are deleterious to device performance.

During conventional semiconductor wafer manufacture, groves aligned to wafer crystal planes are scribed on wafers and the wafers are then cleaved along the groves to form flats in the wafers. The wafers are then subjected to polishing operations because exposed abrupt cleaved surfaces can render the wafers vulnerable to shatter during subsequent processing steps, for example high temperature dopant activation processes, and can result in crystal dislocation defects propagating through the wafers. The polishing processes are effective at smoothing the abrupt cleaved surfaces.

SUMMARY OF THE INVENTION

The inventor has appreciated that manufacturing yield of micromachined electro-optical devices manufactured by registering to polished wafer flats is adversely affected by the alignment accuracy of the polished flats to associated wafer crystal planes. The inventor has further appreciated that, in practice, registration to the polished wafer flats can be repeatedly achieved to an accuracy comparable to that required to the wafer crystal planes. Thus, the inventor has therefrom devised an alignment method according to the invention.

Thus, according to a first aspect of the present invention, there is provided a method of alignment for aligning crystal planes of a wafer substrate to lithographic features thereon, the method characterised in that it includes the steps of:
(a) measuring angular orientation of a peripheral flat of the substrate;
(b) measuring a crystallographic plane orientation of the substrate;
(c) determining an error angle between the angular orientation of the flat and the crystallographic orientation;
(d) angularly registering to the flat in a lithographic tool;
(e) rotating the substrate by the error angle; and
(f) defining one or more feature layers on the substrate using the lithographic tool, thereby angularly aligning the one or more feature layers to the crystallographic plane orientation.

The method provides the advantage that it is capable of more accurately aligning the feature layers to the crystallographic plane orientation.

Preferably, the crystallographic plane orientation is measured using X-ray diffraction means. X-ray diffraction techniques provide the benefit of non-contact non-invasive measurement of crystal plane orientation. Moreover, such techniques can be performed rapidly which is important in semiconductor manufacturing environments. It is especially preferable that the X-ray diffraction means is operable to interrogate a peripheral edge of the substrate.

The inventor has found it preferable to perform the aforementioned method of the invention by employing an X-ray diffraction means comprising an X-ray source for generating X-ray radiation, a beam conditioner for forming the X-ray radiation into an X-ray beam directed towards the substrate, and an X-ray detector for receiving a diffracted portion of the beam emitted from the substrate. Moreover, the inventor has found it preferable to arrange the diffraction means so that the crystallographic orientation of the substrate is determined by maximising an X-ray radiation count in the detector as the substrate is rotated.

In a second aspect of the present invention, there is provided an apparatus for performing a method of alignment according to the first aspect, the apparatus comprising:
(a) first measuring means for measuring angular orientation of one or more peripheral flats on a wafer substrate;
(b) second measuring means for measuring a crystallographic orientation of the substrate; and
(c) substrate rotating means for rotating the substrate relative to the first and second measuring means.

Preferably, the second measuring means is an X-ray diffractometer device. Such a device is capable of providing non-contact non-invasive and rapid measurement of crystallographic orientation.

BRIEF DESCRIPTION OF THE DRAWINGS

Embodiments of the invention will now be described, by way of example only, with reference to the following diagrams in which.

DESCRIPTION OF ILLUSTRATED EMBODIMENT

Figure 1:
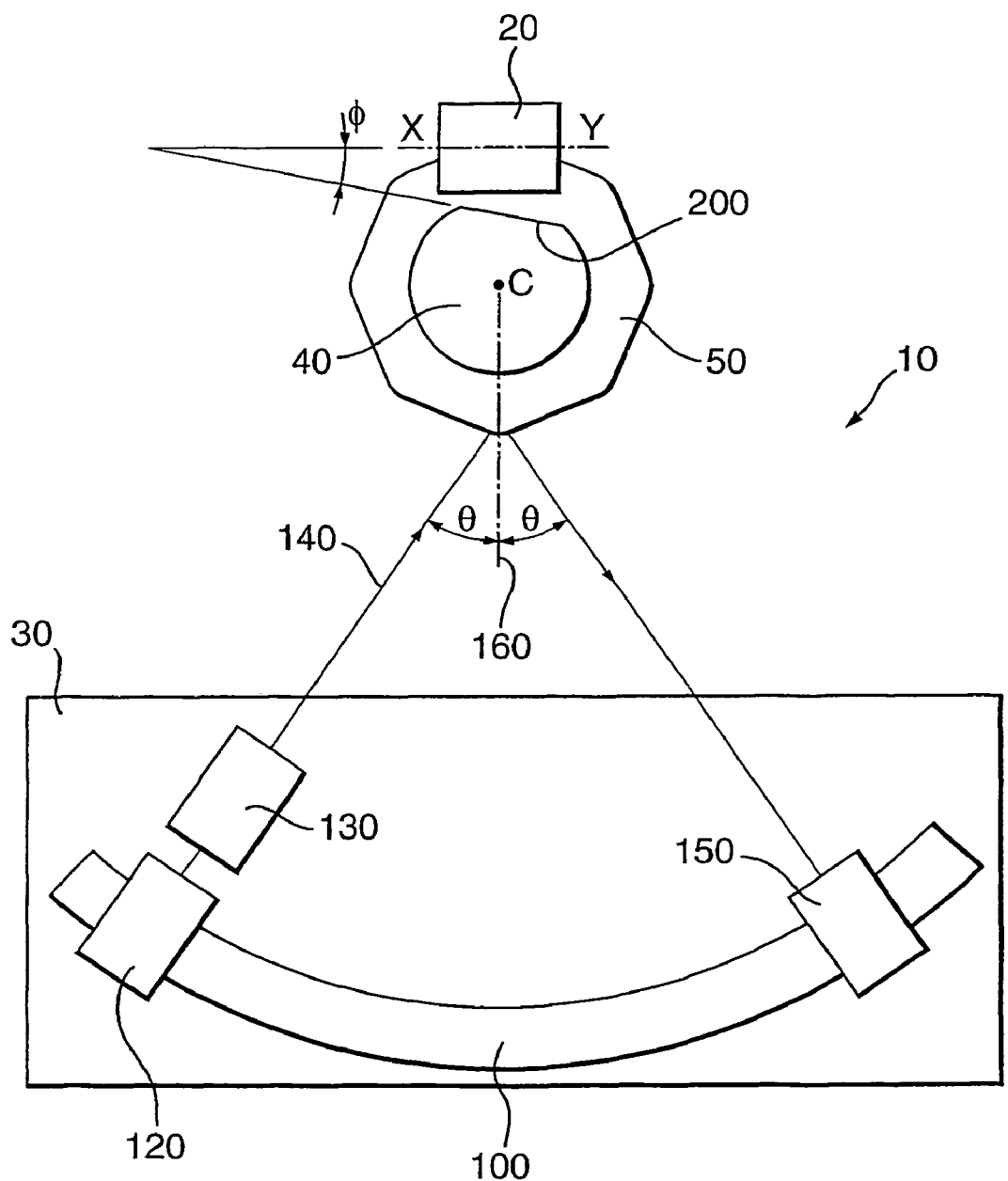
FIG. 1 is a schematic illustration of an alignment apparatus for use in the method according to the invention.

It is well known that semiconductor wafers are cut from single-crystal ingots grown in crystal growing apparatus. The ingots can be grown in a number of alternative crystal orientations. There therefore arises a need within the semiconductor industry to have a manner of marking wafers to indicate their respective crystal orientation. Such marking is conventionally achieved by forming flats at peripheral edges of wafers. The flats are employed for coarsely orientating the wafers in automatic processing equipment during semiconductor device manufacture prior to applying precision registration processes based on optical inspection of surface features on one or major polished faces of the wafer to ensure precise device layer overlay registration. A problem arises for an initial feature layer to be formed on one or more of the major faces where no registration features preexist other than the aforementioned flats.

When semiconductor devices such as memory devices are fabricated, angular alignment of device features to wafer crystal planes are not critical; however, high speed logic devices fabricated in certain crystal orientations tend to function more rapidly because electron and hole mobilities are slightly anisotropic in silicon and III-V compounds. When such memory devices are fabricated, polished wafer flats provide a sufficiently accurate angular alignment when forming initial layers.

A particular problem of angular alignment of initial feature layers arises in the case of micromachined semiconductor devices which rely on device features being accurately aligned to wafer crystal planes. The problem is pertinent in the case of silicon wafers which are to be anisotropically etched using, for example, potassium hydroxide solution to form device features; moreover, the problem is also relevant in the case of III-V compound wafers which are to be cleaved to yield mirror-like planes for electro-optical devices.

There are a plurality of established conventions concerning the position and size of wafer flats. For 50 mm diameter wafers following the conventions, each wafer includes a major flat of length 16+/−2 mm roughly parallel to the <110> crystal plane, and a minor flat of length 8+/−1 mm roughly parallel to the <110> crystal plane. As described in the foregoing, these flats are found in practice by the inventor to be insufficiently accurately aligned to the crystal planes to be relied upon for angular registration when delineating initial device layers of electro-optical devices incorporating cleaved mirror-like planes. However, the inventor has unexpected found that registration to polished wafer flats can be achieved to a high degree of accuracy and repeatability using contemporary wafer-flat optical or mechanical registration tools.

Thus, the inventor has appreciated that prior to delineating an initial device layer on a semiconductor wafer, it is feasible to measure an error angle between one or more wafer flats of the wafer and its crystal orientation. The error angle can be used as a data parameter which accompanies the wafer in its subsequent fabrication processing steps; the error angle can be used as a correction angle to be applied after angularly registering to the one or more flats to ensure that initial delineated features formed on the wafer are more accurately angularly aligned to the crystal planes of the wafer than possible if only registration to the flats were relied upon.

The method of the invention will now be described in more detail with reference to FIG. 1. In FIG. 1, there is shown an alignment apparatus for use in the method, the apparatus indicated generally by 10. The apparatus 10 comprises a conventional optical flat registration device 20 and an X-ray diffractometer indicated by 30. The registration device 20 is, for example, a proprietary device type ? manufactured by ?. The diffractometer 30 is positioned relative to a wafer 40 mounted on a rotatable wafer chuck 50 for measuring crystal plane orientation of the wafer 40 relative to the diffractometer 30.

The diffractometer 30 includes an arcuate track 100 onto which is mounted a first assembly and a second assembly. The first assembly comprises an X-ray radiation source 120 coupled to an associated X-ray beam conditioner 130. The second assembly includes an X-ray detector 150. The assemblies are slidably adjustable along the track 100 for varying an angle $\theta$ at which an X-ray beam 140 emitted from the first assembly and reflected from a peripheral edge of the wafer 40 subtends with respect to a central axis 160 as shown in FIG. 1. The axis 160 is radially orientated with respect to a centre C of the wafer 40 and its associated chuck 50. In operation, the angle $\theta$ is varied depending upon the order of X-ray diffraction employed, the free-space wavelength of X-ray radiation forming the beam 140 and the material from which the wafer 40 is formed.

Operation of the apparatus 10 for determining an angular error between a wafer flat 200 on the wafer and wafer crystal orientation will now be described with reference to FIG. 1.

Step 1:

Initial calibration of the apparatus 10 is required. Such calibration is achieved using a calibration wafer. The calibration wafer is prepared by taking a semiconductor wafer including a minor flat, for example a flat of 8+/−1 mm length in a 50 mm diameter wafer, scribing a grove parallel to the flat further towards the centre C of the wafer and then cleaving the calibration wafer at the grove to present a mirror-quality <110> abrupt cleaved edge 200 to the wafer which is accurately aligned with respect to crystal planes within the wafer. The cleaved edge preferably has a length of 16+/−2 mm, namely similar in size to normal major wafer flat.

The calibration wafer is mounted on the chuck 100. The cleaved edge 200 is then offered to the flat registration device 20 and the chuck 100 rotated until the cleaved edge is angularly aligned to the device 20, namely the edge 200 is parallel to an axis X-Y. The diffractometer 30 is then rotated as a complete assembly about the centre C until an X-ray count rate of the detector 150 is maximal corresponding to alignment of the diffractometer 30 to <110> crystal planes of the calibration wafer.

This STEP 1 ensures that that the flat registration device 20 and the diffractometer 30 are mutually angularly aligned, since both are aligned to the <110> crystal plane of the calibration wafer.

Step 2:

The production wafer 40 is next mounted onto the chuck 100 in substitution of the calibration wafer, the wafer 40 having a polished flat thereon. The registration device 20 measures the alignment of the polished flat 200 of the wafer 40 and the chuck 100 is rotated until the polished flat is aligned to the X-Y axis of the device 20. The chuck 100 is then rotated by an angle $\phi$ whereat the X-ray count rate of the X-ray detector 150 is maximal. The angle $\phi$ is then an error angle between the <110> crystal planes of the production wafer 40 and its associated flat 200.

This angle $\phi$ for the production wafer 40 is a parameter which accompanies the wafer 40 through its subsequent production processes.

STEPS 1 and 2 above are then complete.

In electro-optical device fabrication, it is a first lithographic step which is critical to ensuring that delineated features are aligned to crystal planes of a wafer. Thus, when projecting a first-layer mask image in a lithographic tool, for example using a step-and-repeat camera, to delineate a first layer of features onto the production wafer 40, the wafer 40 is placed on a wafer chuck of the tool and a wafer flat registration device of the tool is invoked to align the polished flat 200 of the wafer 40 to the device. The wafer chuck of the tool is then rotated by the angle $\phi$ so that crystal planes of the wafer 40 are aligned with respect to features in a lithographic mask loaded into the tool for delineating the first layer of features onto the wafer 40. Thus, by rotating the wafer 40 by the angle φ in the lithographic tool, improved feature-to-crystal plane alignment is achieved; such improved alignment is important for achieving improved electro-optical device yields from the wafer 40. If such an angular correction were not applied, device yield from the wafer 40 would be lower.

Subsequent feature layers projected and formed onto the wafer are registered with respect to the first feature layer and are thereby angularly aligned to the crystal planes of the wafer 40.

It will be appreciated that modifications can be made to the apparatus 10 and also to the aforementioned method of the invention without departing from the scope of the invention. For example, the configuration of the diffractometer 30 can be changed provided that it is capable of measuring wafer crystal plane orientation.

The invention claimed is:

1. A method of alignment crystal planes of a wafer substrate to lithographic features thereon, the method comprising the steps of:
    (a) measuring an angular orientation of a peripheral flat of the substrate;
    (b) measuring a crystallographic plane orientation of the substrate; and
    (c) determining an error angle between the angular orientation of the flat and the crystallographic orientation; and subsequently:
    (d) angularly registering to the flat in a lithographic tool; then:
    (e) rotating the substrate by the error angle; and then:
    (f) defining one or more feature layers on the substrate using the lithographic tool, thereby angularly aligning the one or more feature layers to the crystallographic plane orientation.

2. A method according to claim 1, wherein the error angle is a parameter which accompanies the wafer substrate through subsequent production processes.

3. A method according to claim 2, wherein step (f) of claim 1 further comprises the step of employing subsequent production processes.

4. A method according to claim 1, wherein step (b) further comprises the step of measuring the crystallographic plane orientation using X-ray diffraction means.

5. A method according to claim 4, further comprising the step of employing the X-ray diffraction means to interrogate a peripheral edge of the substrate.

6. A method according to claim 4, wherein the X-ray diffraction means comprises an X-ray source for generating X-ray radiation, a beam conditioner for forming the X-ray radiation into an X-ray beam directed towards the substrate, and an X-ray detector for receiving a diffracted portion of the beam emitted from the substrate.

7. A method according to claim 6, further comprising the step of determining the crystallographic plane orientation by maximizing an X-ray radiation count in the detector as the substrate is rotated.

8. An apparatus for performing a method of alignment for aligning a wafer substrate, the apparatus comprising:
    (a) first measuring means for measuring an angular orientation of one or more peripheral flats on a wafer substrate;
    (b) second measuring means for measuring a crystallographic orientation of the substrate, the second measuring means comprising an X-ray diffractometer device adapted to measure the crystallographic orientation of the substrate by maximizing an X-ray radiation count; and
    (c) substrate rotating means for rotating the substrate relative to the first and second measuring means.

9. An apparatus according to claim 8, wherein the second measuring means is an X-ray diffractometer device.

10. An apparatus according to claim 8, further comprising a lithographic tool by which one or more feature layers may be defined on the wafer substrate.

11. An apparatus according to claim 10, wherein the lithographic tool is arranged to define the one or more feature layers on the wafer substrate when the wafer substrate has been aligned by means of orientation measurements made by the first and second measuring means and by means of rotation by the substrate rotating means, the rotation being dependent upon the orientation measurements of the first and second measuring means.

12. An apparatus according to claim 8, further comprising means for determining an angular error between a wafer flat on the wafer substrate and the crystallographic orientation of the wafer substrate.

* * * * *